United States Patent [19]

Smith

[11] Patent Number: 4,494,826

[45] Date of Patent: Jan. 22, 1985

[54] SURFACE DEFORMATION IMAGE DEVICE

[76] Inventor: James L. Smith, 426 High School Dr., Grand Prairie, Tex. 75050

[21] Appl. No.: 108,933

[22] Filed: Dec. 31, 1979

[51] Int. Cl.³ .............................................. G02F 1/29
[52] U.S. Cl. .................................... 350/360; 350/359
[58] Field of Search ................................ 350/360, 359

[56] References Cited

U.S. PATENT DOCUMENTS

| | | | |
|---|---|---|---|
| 3,214,272 | 10/1965 | Ploke | 350/360 |
| 3,283,309 | 11/1966 | Gaynor | 350/360 |
| 3,716,359 | 2/1973 | Sheridon | 350/360 |
| 4,119,368 | 10/1978 | Yamazaki | 350/360 |

Primary Examiner—William L. Sikes
Assistant Examiner—Léon Scott, Jr.
Attorney, Agent, or Firm—Anthony T. Lane; Robert P. Gibson; Robert C. Sims

[57] ABSTRACT

A device capable of spatially modulating a collimated read-out light beam with an input image is described. The most essential elements of the key unit in this device include a photoconducting layer, charged grille-structure, an elastomer, and a thin metal anode. Real-time and storage operation is possible.

4 Claims, 4 Drawing Figures

SURFACE DEFORMATION IMAGE DEVICE

The invention described herein may be manufactured, used, and licensed by or for the Government for governmental purposes without the payment to me of any royalties thereon.

BACKGROUND OF THE INVENTION

Surface deformation image devices fall into three categories. First, there is the Eidophor-type projector which uses an electron beam to cause deformation in an oil surface in such a way as to modulate light being projected through it. Thus, after passing through Schlieren-type optics, the light is displayed on a screen. The light pattern is related to the electron beam modulation. In this way a television program can be projected brightly on a large screen. Very closely related is the G.E. coherent light value which is essentially the same except that coherent light is projected through, and the electron beam modulation may be such as to produce a hologram pattern, rather than the image itself. Secondly, the photothermoplastic devices undergo deformation during a heating cycle according to the electric field pattern across it induced by light falling on an adjacent electrode-coated photoconductor layer. The free surface is coated with positive ions generally created from a nearby corona discharge. A cooling cycle then freezes the deformation in the surface. Such a device can be used to store images or holograms. The third category is what Xerox Corporation calls the Ruticon family of devices. (IEEE Transactions on Electron Devices, Vol. ED-19, No. 9, September 1972, pages 1003–1010 and Applied Optics, Vol. 14, No. 8, August 1975, pages 1770–1771. These devices can be used for realtime or storage applications. The advantage of this family is that no television electronics or heating-cooling cycle is required for their operation. There are three types of Ruticons, but the one which is most closely related to the present invention disclosure is the so-called $\gamma$-Ruticon (Gamma Ruticon).

DESCRIPTION OF THE PREFERRED EMBODIMENT

Figure 1:
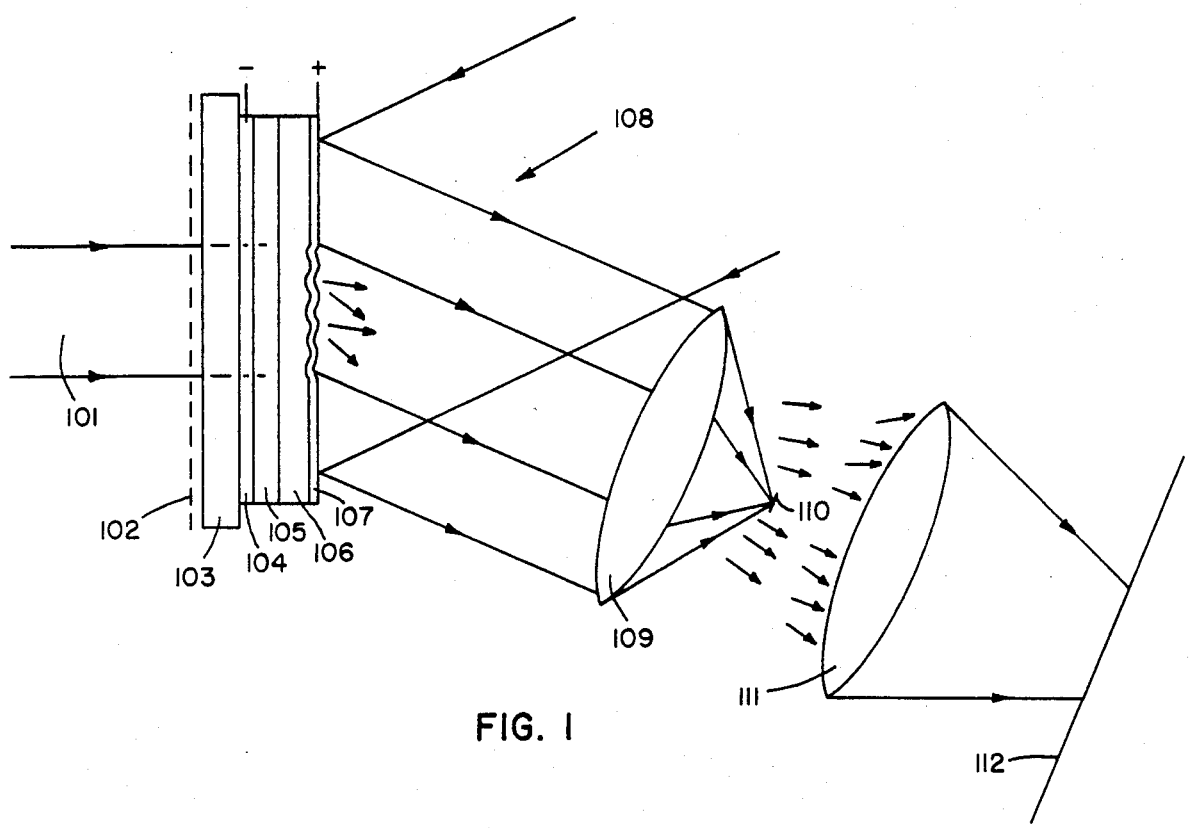
FIG. 1 is a diagrammatic showing of a surface deformation image device.

A drawing of the $\gamma$-Ruticon is shown in FIG. 1. (not claimed, for comparison only.) Light strikes the device from the left. It passes through spatial modulator 102, a transparent substrate 103, a negative potential transparent conductor 104, and into a photoconductor layer 105. This causes a charge redistribution and, hence, a change of electric field across the following elastomer layer 106. Since the following metal layer 107 is very thin, the inhomogeneous field causes deformation of the elastomer and, hence, the output metal surface. For imaging applications, a spatial modulation (e.g. a Ronchi ruling) is imposed on the input light. Thus, a bright portion of the input image induces periodic deformation on the output surface, and no deformation elsewhere. A well collimated light source 108 which reflects off the output surface is no longer collimated where there is light on the input surface and retains collimation elsewhere. The reflected beam then passes through a lens 109 with an opaque stop 110 at the focal point which eliminates collimated reflected light, but not the rest because it passes around the stop. A following lens 111 then focuses an output image on a screen 112. The $\gamma$-Ruticon can be used several ways: As an image intensifier, an image wavelength converter, and, if a negative of the input image is allowable, an incoherent-to-coherent light converter accomplished by replacing the opaque stop by a pinhole stop.

Undesirable limitations on the $\gamma$-Ruticon are (1) the input spatial modulator cannot exceed approximately 25 lines/mm without poor output contrast, i.e. resolution is limited, (2) if storage of an image is required after its removal, dark current leakage in the photoconductor limits image retention to approximately 2 minutes, and (3) when incoherent-to-coherent conversion of image light is desired, one obtains the negative of the input image.

Figure 2:
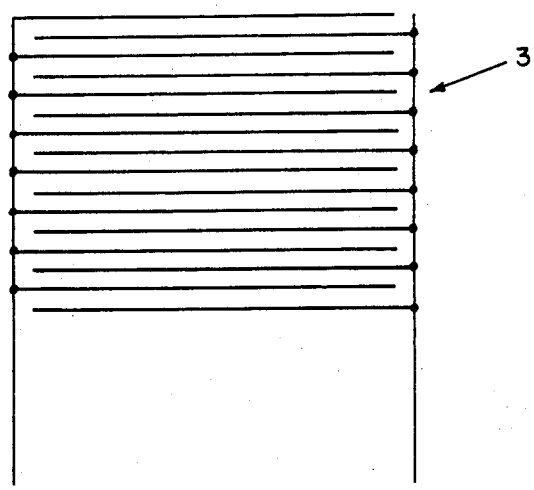
FIG. 2 is a diagrammatic showning the grille structure of the present invention.

The invention disclosed here addresses the three undesirable limitations on the $\gamma$-Ruticon. Because of the different structure concept proposed, a versatility is attained which allows one to eliminate or reduce one or more of the aforementioned problems with each design/use option, which consists mainly of scaling and operating procedure. The structure difference consists first of placing a charged grille structure in (or in contact with) the photoconductor, letting the applied bias exist between the grille and the fixed-potential metal layer on the output surface. The discontinuous nature of the grille structure (FIG. 2) eliminates the need for a spatial modulator on the input light and makes possible a second structural difference: The transparent electrode which the $\gamma$-Ruticon has may be entirely eliminated, Whereas the $\gamma$-Ruticon elastomer is normally smooth with zero input, the disclosed device is normally wrinkled and smooths with an input.

The invention disclosed here has use in (1) real-time image intensification for observation of weakly lighted objects, (2) conversion of image light wavelength, (3) incoherent-to-coherent image light conversion, and (4) storage of transient images. Applications to missile systems and aerial reconnaissance are evident since target or geography recognition and analysis through optical data processing (which generally needs incoherent-to-coherent conversion) is highly desirable.

The option to have opposite polarity on alternate grille lines and a high-resistance photoconductor optimizes storage. A second option to have all grille lines with the same polarity and a lower-resistance photoconductor optimizes resolution and speed, respectively.

Figure 3:
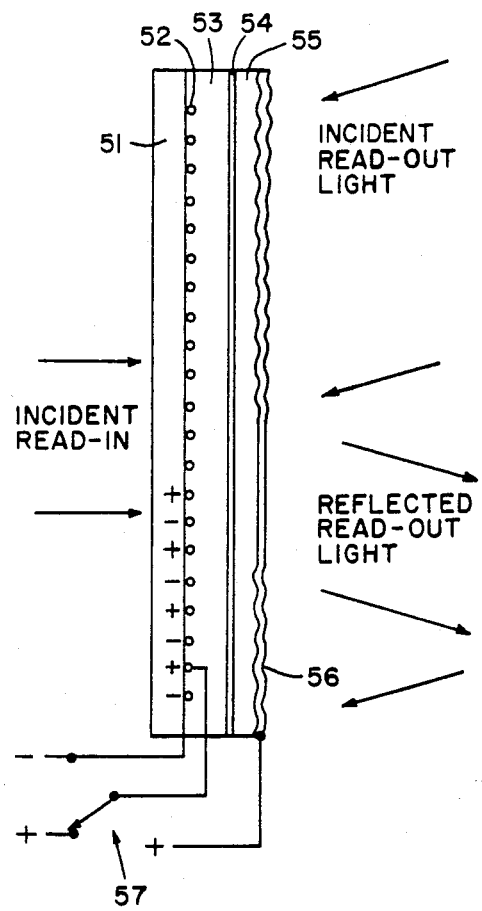
FIG. 3 is a showning of the embodiment of the present invention.

The key modulator element is shown in profile in FIG. 3. The transparent substrate 51 allows light from the left to pass through. Next, bonded onto the substrate is the grille structure 52, every other line being connected to the same potential and the remaining connected to the opposite potential. However, a switch 57 provides the option for all grille lines to have the same potential. Either way, grille lines provide a periodic electric field in the device. A photoconducting layer 53 is located in front of and/or between grille lines. This layer is of e.g., uniform Si or CdS or CdS powder in plastic or gelatin binder, or polyvinylcarbazole. The next layer 54 is optional; an optical isolation layer 54 which prevents readout light from striking the photoconductor. The elastomer 55 follows. A special clear Silicon rubber is an example of a workable elastomer. The surface of the elastomer is metallized with a thin, smooth In and/or Au film 56 which is held at a given potential. When an image is focused on the input side of the modulator, readout light striking and reflecting off the readout side carries the image which can be observed on a screen by passing the readout beam through appropriate optics.

OPERATION: GENERAL APPLICATION CONFIGURATION

Figure 4:
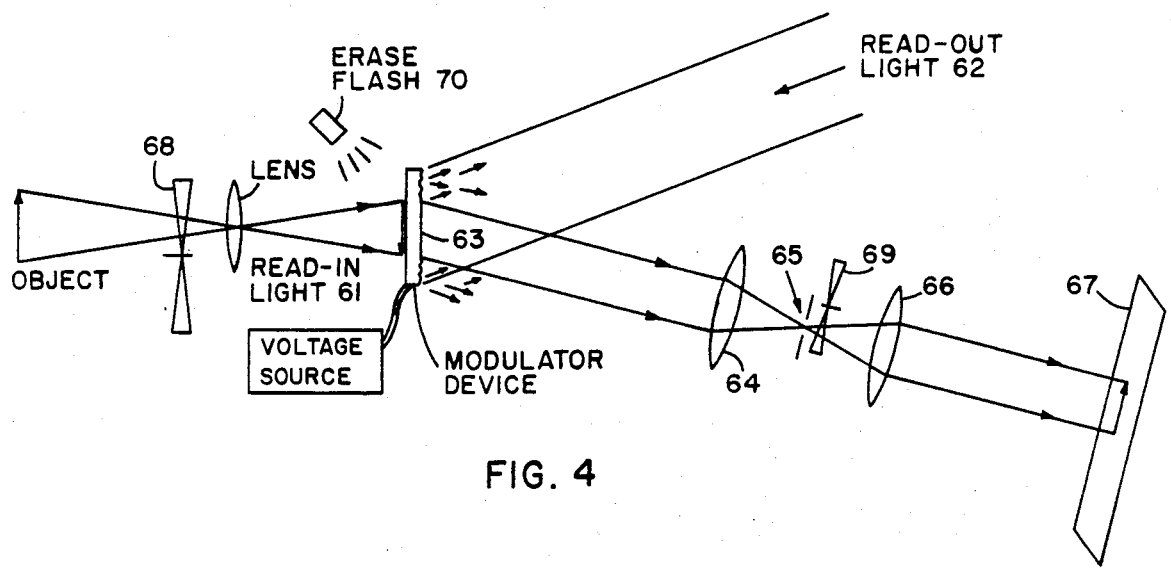
FIG. 4 is a showning of the embodiment in an overall system.

Referring to FIG. 4, the input light 61 incident on the left embodies an image which passes through the transparent substrate and focuses on the photoconducting layer. Readout light 62 incident from the right (generally collimated, though not necessarily), reflects off the metallized elastomer in a widely scattered manner except where incident light has caused the normally wrinkled metallized elastomer surface to smooth 63. Reflection from the smooth areas passes through a lens 64, and then a pinhole aperture 65. Most scattered light will not pass through the pinhole whereas the light reflecting from the smooth regions will pass through (if readout light is collimated, reflection from smooth regions will also be collimated and will later pass through a pinhole 65 located at the focal point of the lens 64.)

After passing through the pinhole, the light encounters another lens 65 which focuses the transferred image onto a screen 67. Spatial filtering is possible at the pinhole region, if desired.

OPERATION: FIRST OPTION REAL-TIME (Refer to FIGS. 3 and 4)

1. Alternate grille lines 52 are of opposite polarity, the metal film 56 on the elastomer 55 surface is positively (or negatively) charged. Elastomer-metal surface is wrinkled with the periodicity of the grille line pairs.

2. Read-in light from the left strikes the device and penetrates to the photoconducting layer 53. Photocurrent relaxes periodicity in the electric field due to charge redistribution which shields the grille lines. Grille lines have high contact resistance with the photoconductor so that space charge can build up.

3. Negative (or positive) potential on alternate grille lines is reduced somewhat to aid elimination of electric field periodicity in the light-exposed region.

4. The elastomer 55 relaxes in the light-exposed region due to the reduction of electric field periodicity. The metallized surface 56 becomes smooth and specularly reflecting.

5. Read-out light 62 from the right now strikes the metallized elastomer. Reflected light scatters through wide angles in the region where the elastomer is wrinkled, but reflects specularly where the elastomer is smooth. This is the basis for the image transfer.

6. Read-in light is shuttered off by shutter 68, readout light is shuttered off by shutter 69 from the observation screen, and an erase flash 70 from the left floods the photoconducting layer as the alternate electric potential on the grid lines is momentarily reversed. This is the erase (or reset) phase.

7. The grid line potential alternation is changed back to its original configuration, and the read-in light is introduced from the left. The cycle begins again.

OPERATION: STORAGE

Use of a nonlinear high-resistivity photoconductor of a type which requires a high electric field for conduction (e.g., photon-assisted barrier tunneling) is appropriate to long-term image storage. Opposite polarity on alternate grille lines provides high fields for photoconduction without unnecessarily high, potentially damaging fields across the elastomer. For storage the read-in phase and the readout phase are the same as above. Instead of following with the erase phase, however, the read-in light is shut off, potential difference between grille lines is reduced, and the readout light is maintained (or is turned on later when it is desired to read the last recorded image).

OPERATION: SECOND OPTION REAL-TIME (See FIG. 3)

For applications where speed is important and very short-term storage is adequate, a conventional photoconductor not requiring very high fields for charge transport may be used. In this case, alternate grille lines may be of the same polarity (opposite that of the output surface electrode) so that resolution (in lines/mm) is doubled. Switch 57 provides this option.

I claim:

1. A surface deformation image device comprising a plurality of laminated layers; a first layer being a transparent supporting substrate; a second layer being a grille structure layer; a third layer being photoconducting layer in electrical contact with said grille structure layer; a fourth layer being an elastomer layer; a thin metal film coating layer on said elastomer layer; terminals being connected to said thin metal film layer and said grille structure layer such that electrical potential can be applied across said layers, excepting said first layer, causing selective declination of the elastomer layer and therefore the metal film coating, said elastomer layer relaxing in corresponding areas of said photoconductive layer which are struck by electromagnetic energy; an electrical switch; and said grille structure being made up of a plurality of lines connected to said electrical switch such that alternate lines are connected to given voltage polarity and the lines remaining may be switched to either similar or opposite voltage.

2. A device as set forth in claim 1 wherein said grille structure layer is inside said photoconductive layer.

3. A device as set forth in claim 1 or 2 wherein said photoconductor layer is of the type which requires high electric field for significant photoconduction such as CdS powder in plastic.

4. A device as set forth in claim 1 wherein a nonconducting light blocking layer is situated between said photoconductor and said elastomer layers.

* * * * *